(12) United States Patent
Wang et al.

(10) Patent No.: US 11,411,136 B2
(45) Date of Patent: Aug. 9, 2022

(54) MICRO LIGHT-EMITTING DIODE CHIP

(71) Applicant: PlayNitride Display Co., Ltd., MiaoLi County (TW)

(72) Inventors: Tzu-Wen Wang, MiaoLi County (TW); Hsin-Chiao Fang, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/076,781

(22) Filed: Oct. 21, 2020

(65) Prior Publication Data

US 2021/0367105 A1 Nov. 25, 2021

(30) Foreign Application Priority Data

May 19, 2020 (TW) .................. 109116474

(51) Int. Cl.
*H01L 33/30* (2010.01)
*H01L 33/62* (2010.01)
*H01L 33/00* (2010.01)

(52) U.S. Cl.
CPC ........ *H01L 33/305* (2013.01); *H01L 33/0008* (2013.01); *H01L 33/62* (2013.01)

(58) Field of Classification Search
CPC combination set(s) only.
See application file for complete search history.

(56) References Cited

U.S. PATENT DOCUMENTS

| | | |
|---|---|---|
| 6,515,308 B1 | 2/2003 | Kneissl et al. |
| 2005/0287687 A1 | 12/2005 | Liao et al. |
| 2013/0192656 A1* | 8/2013 | Hardin .............. H01L 31/02363 438/94 |
| 2018/0006645 A1* | 1/2018 | Kondo ................. H01L 31/125 |
| 2018/0331255 A1* | 11/2018 | Grundmann ........ H01L 33/0025 |
| 2020/0052137 A1* | 2/2020 | Maros .................... H01L 33/12 |

FOREIGN PATENT DOCUMENTS

| | | |
|---|---|---|
| CN | 1819285 | 8/2006 |
| CN | 101897048 | 11/2010 |
| CN | 104538527 | 4/2015 |
| CN | 107546303 | 1/2018 |

(Continued)

OTHER PUBLICATIONS

"Office Action of China Counterpart Application", dated Dec. 3, 2020, p. 1-p. 8.

(Continued)

*Primary Examiner* — Julio J Maldonado
*Assistant Examiner* — Mohammad A Rahman
(74) *Attorney, Agent, or Firm* — JCIPRNET

(57) ABSTRACT

A micro light-emitting diode (micro-LED) chip adapted to emit a red light or an infrared light is provided. The micro-LED chip includes a GaAs epitaxial structure layer, a first electrode, and a second electrode. The GaAs epitaxial structure layer includes an N-type contact layer, a tunneling junction layer, a P-type semiconductor layer, a light-emitting layer, an N-type semiconductor layer, and an N-type window layer along a stacking direction. The first electrode electrically contacts the N-type contact layer. The second electrode electrically contacts the N-type window layer.

11 Claims, 6 Drawing Sheets

(56) References Cited

FOREIGN PATENT DOCUMENTS

| | | |
|---|---|---|
| CN | 107681034 | 2/2018 |
| CN | 109244205 | 1/2019 |
| CN | 109545940 | 3/2019 |
| CN | 110915005 | 3/2020 |
| TW | 493287 | 7/2002 |
| TW | 201801343 | 1/2018 |

OTHER PUBLICATIONS

"Office Action of Taiwan Counterpart Application", dated Dec. 23, 2020, p. 1-p. 3.

\* cited by examiner

MICRO LIGHT-EMITTING DIODE CHIP

CROSS-REFERENCE TO RELATED APPLICATION

This application claims the priority benefit of Taiwan patent application serial no. 109116474, filed on May 19, 2020. The entirety of the above-mentioned patent application is hereby incorporated by reference herein and made a part of specification.

BACKGROUND

Technical Field

The disclosure relates to a chip, and in particular to a micro light-emitting diode (micro-LED) chip.

Description of Related Art

In general, a red light is generated by adopting an N-type gallium arsenide (GaAs) substrate as an epitaxial growth substrate, and after an N-type semiconductor layer is formed on the growth substrate, a light-emitting layer and a P-type semiconductor layer are sequentially formed. The material costs of the N-type GaAs substrate are relatively low, while it is more difficult to control the yield of the N-type GaAs substrate.

Although a P-type GaAs substrate may also be adopted as the epitaxial growth substrate, and after the P-type semiconductor layer is formed on the growth substrate, the light-emitting layer and the N-type semiconductor layers are sequentially formed. However, the cost of the P-type GaAs substrate is at least twice the cost of the N-type GaAs substrate. Hence, how to take both the cost and yield quality into consideration is one of the research topics in the pertinent technical field.

SUMMARY

The disclosure provides a micro-LED chip with a structure which may improve the yield in the manufacturing process.

An embodiment of the disclosure provides a micro-LED chip adapted to emit a red light, and the micro-LED chip includes a GaAs epitaxial structure layer, a first electrode, and a second electrode. The GaAs epitaxial structure layer includes an N-type contact layer, a tunneling junction layer, a P-type semiconductor layer, a light-emitting layer, an N-type semiconductor layer, and an N-type window layer along a stacking direction. The first electrode electrically contacts the N-type contact layer. The second electrode electrically contacts the N-type window layer.

In an embodiment of the disclosure, the first electrode and the second electrode are located on one side of the micro-LED chip opposite to a stacking direction.

In an embodiment of the disclosure, the GaAs epitaxial structure layer has a concave portion. The concave portion defines a platform structure, and the concave portion exposes a first surface of the N-type window layer on one side of the N-type window layer opposite to the stacking direction.

In an embodiment of the disclosure, the N-type contact layer, the tunneling junction layer, the P-type semiconductor layer, the light-emitting layer, the N-type semiconductor layer, and a portion of the N-type window layer of the GaAs epitaxial structure layer form a platform structure. An area of a platform surface of the platform structure is smaller than an area of a second surface of the N-type window layer on the other side of the N-type window layer facing the stacking direction. The platform surface is a surface of the N-type contact layer on the one side opposite to the stacking direction.

In an embodiment of the disclosure, the GaAs epitaxial structure layer has a trench. The trench passes through the N-type contact layer, the tunneling junction layer, the P-type semiconductor layer, the light-emitting layer, the N-type semiconductor layer, and a portion of the N-type window layer, and the trench exposes a third surface of the N-type window layer on one side of the N-type window layer opposite to the stacking direction.

In an embodiment of the disclosure, the second electrode is disposed in the trench and electrically contacts the third surface of the N-type window layer.

In an embodiment of the disclosure, the micro-LED chip further includes an insulation layer. The insulation layer covers an inner wall of the trench to electrically insulate the second electrode from the N-type contact layer, the tunneling junction layer, the P-type semiconductor layer, the light-emitting layer, and the N-type semiconductor layer. The insulation layer extends to a surface of the N-type contact layer on the one side of the N-type contact layer opposite to the stacking direction.

In an embodiment of the disclosure, a thickness of the tunneling junction layer along the stacking direction falls within a range of 50 angstroms to 500 angstroms.

In an embodiment of the disclosure, each of a thickness of the N-type contact layer, a thickness of the tunneling junction layer, and a thickness of the light-emitting layer along the stacking direction is less than a thickness of each of the other layers of the GaAs epitaxial structure layer along the stacking direction.

In an embodiment of the disclosure, the tunneling junction layer is doped with both N-type and P-type dopants, and a ratio of a molar concentration of the P-type dopant to a molar concentration of the N-type dopant falls within a range of 10 to 100.

In an embodiment of the disclosure, the molar concentration of the P-type dopant of the tunneling junction layer is greater than a molar concentration of a P-type dopant of the P-type semiconductor layer.

In an embodiment of the disclosure, a base material of the tunneling junction layer is $(Al_xGa_{1-x})_yIn_{1-y}As_zP_{1-z}$, and $0 \leq x, y, z \leq 1$.

In an embodiment of the disclosure, the P-type semiconductor layer has a magnesium dopant.

In view of the above, the micro-LED chip provided in one or more embodiments of the disclosure has the tunneling junction layer formed between the N-type contact layer and the P-type semiconductor layer. Therefore, the P-type semiconductor layer may be formed earlier than the N-type semiconductor layer during a step of increasing the temperature in the semiconductor manufacturing process. As such, the P-type semiconductor layer may be processed at a lower temperature, so that the step of increasing the temperature in the manufacturing subsequent process does not pose any significant impact on the micro-LED chip, whereby the resultant micro-LED chip may have a high yield.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

FIG. 1A to 1E are schematic cross-sectional views of a manufacturing process of a micro-LED chip according to an embodiment of the disclosure. With reference to FIG. 1A to FIG. 1E, an embodiment of the disclosure provides a micro-LED chip 10A, which includes a GaAs epitaxial structure layer 100A, a first electrode 200, and a second electrode 300. In the embodiment, the micro-LED chip 10A is, for instance, a red light or an infrared light micro-LED chip, while the disclosure is not limited thereto.

Figure 1A:
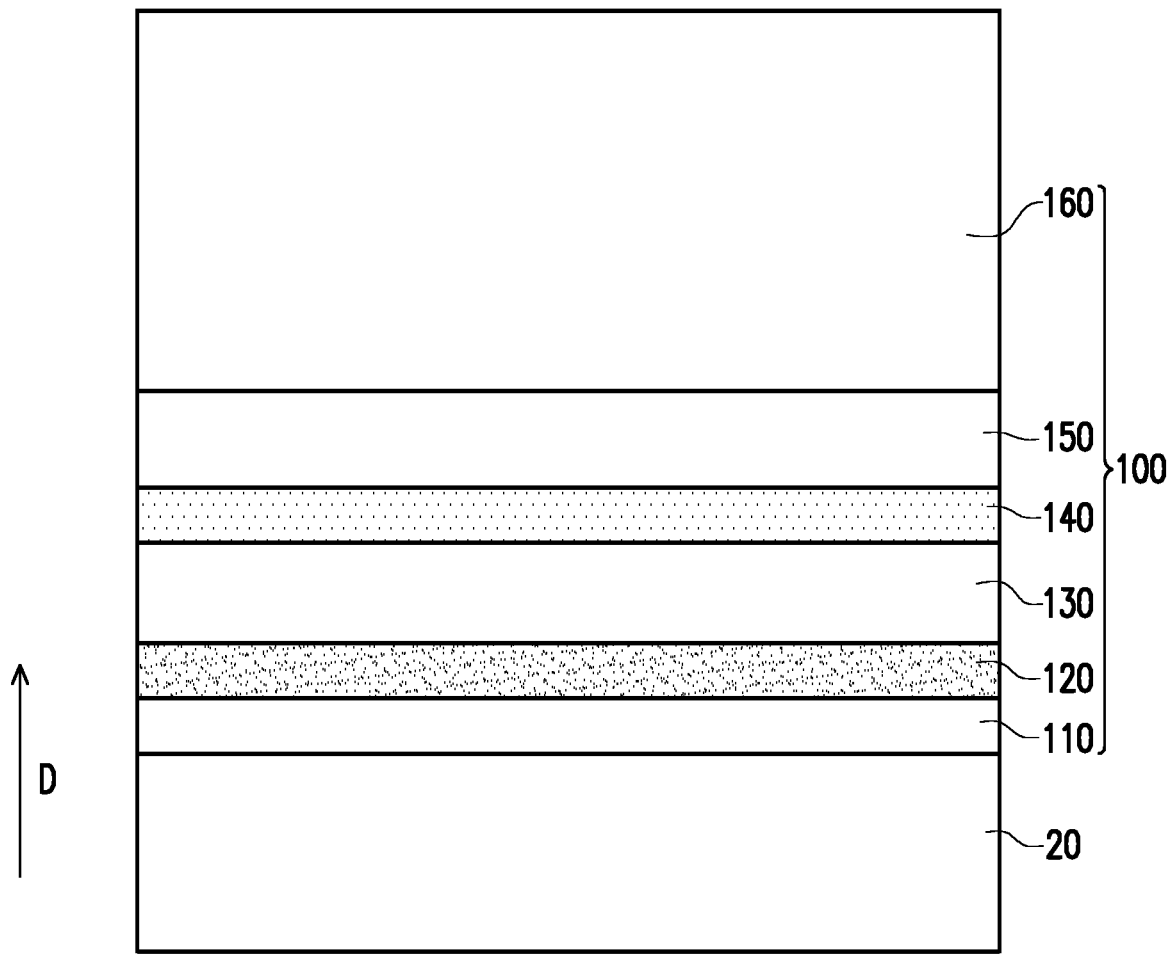
FIG. 1A to 1E are schematic cross-sectional views of a manufacturing process of a micro-LED chip according to an embodiment of the disclosure.

As shown in FIG. 1A, a GaAs epitaxial structure layer 100 is formed on a first substrate 20. In the embodiment, a material of the first substrate 20 is lightly-doped N-GaAs or neutral GaAs. The GaAs epitaxial structure layer 100 includes an N-type contact layer 110, a tunneling junction layer 120, a P-type semiconductor layer 130, a light-emitting layer 140, an N-type semiconductor layer 150, and an N-type window layer 160 sequentially along a stacking direction D. That is, the outermost two semiconductor layers of the GaAs epitaxial structure layer 100 are both the N type.

Generally, the temperature in the semiconductor manufacturing process is usually gradually rising. In order to enable the P-type semiconductor layer 130 to be formed first at a relatively low temperature in the front-end process during the step of increasing the temperature in the semiconductor manufacturing process, the tunneling junction layer 120 is formed between the N-type contact layer 110 and the P-type semiconductor layer 130 in the GaAs epitaxial structure layer 100. That is, the tunneling junction layer 120 serves to convert the N-type contact layer 110 to the P-type semiconductor layer 130 in the GaAs epitaxial structure layer 100. Furthermore, in order to reduce the lattice matching problem during the epitaxial process, the first substrate 20 is preferably made of the lightly-doped N-GaAs or neutral GaAs. If the material of the first substrate 20 is the lightly-doped P-GaAs, another tunneling junction layer is required to be formed between the first substrate 20 and the N-type contact layer 110.

In the embodiment, the N-type contact layer 110 may be highly-doped N-GaAs.

In the embodiment, a base material of the tunneling junction layer 120 may be $(Al_xGa_{1-x})_yIn_{1-y}As_zP_{1-z}$, wherein $0 \leq x, y, z \leq 1$. The tunneling junction layer 120 may be simultaneously highly doped with N-type and P-type dopants. The N-type dopant of the tunneling junction layer 120 is, for instance, silicon (Si) or tellurium (Te), and the P-type dopant is, for instance, carbon (C), magnesium (Mg), or zinc (Zn). In the embodiment, a molar concentration of the P-type dopant is preferably greater than a molar concentration of the N-type dopant. In an embodiment, a ratio of the molar concentration of the P-type dopant to the molar concentration of the N-type dopant of the tunneling junction layer 120 falls within a range of 10 to 100. If the molar concentration of the P-type dopant is excessively low, no tunneling effect may be achieved; if the molar concentration of the P-type dopant is excessively high, an issue of the look of the chip may arise. In addition, a thickness of the tunneling junction layer 120 along the stacking direction D falls within a range of 50 angstroms (Å) to 500 Å.

In the embodiment, the P-type semiconductor layer 130 is configured to provide holes to the light-emitting layer 140, and the N-type semiconductor layer 150 is configured to provide electrons to the light-emitting layer 140, so that the electrons and holes are combined in the light-emitting layer 140 and convert energy into photons to emit light.

In the embodiment, the base material of the P-type semiconductor layer 130 may be $(Al_xGa_{1-x})_yIn_{1-y}As_zP_{1-z}$, and the dopant may be $0 \leq x, y, z \leq 1$. In addition, the molar concentration of the P-type dopant of the tunneling junction layer 120 is preferably greater than a molar concentration of the P-type dopant of the P-type semiconductor layer 130.

In the embodiment, the light-emitting layer 140 may have a multiple-quantum well (MQW) structure, a single-quantum well structure, a double heterostructure, a single heterostructure, or a combination thereof. A material of the light-emitting layer 140 may be a semiconductor material of the GaAs system, preferably $(Al_xGa_{1-x})_yIn_{1-y}As_zP_{1-z}$, wherein $0 \leq x, y, z \leq 1$.

In the embodiment, the base material of the N-type semiconductor layer 150 may be $(Al_xGa_{1-x})_yIn_{1-y}As_zP_{1-z}$, and the dopant may be Si or Te, wherein $0 \leq x, y, z \leq 1$.

In the embodiment, the N-type window layer 160 serves as a light extraction layer. The base material of the N-type window layer 160 may be $(Al_xGa_{1-x})_yIn_{1-y}As_zP_{1-z}$, and the dopant may be Si or Te, wherein $0 \leq x, y, z \leq 1$.

In an embodiment, the molar concentration of the P-type dopant of the P-type semiconductor layer 130 is between 1E17 and 2E18, and the molar concentration of the N-type dopant of the N-type semiconductor layer 150 is between 1E18 and 2E18. The molar concentrations of the P-type dopant and N-type dopant of the tunneling junction layer 120 are respectively greater than 1E19.

Figure 1B:
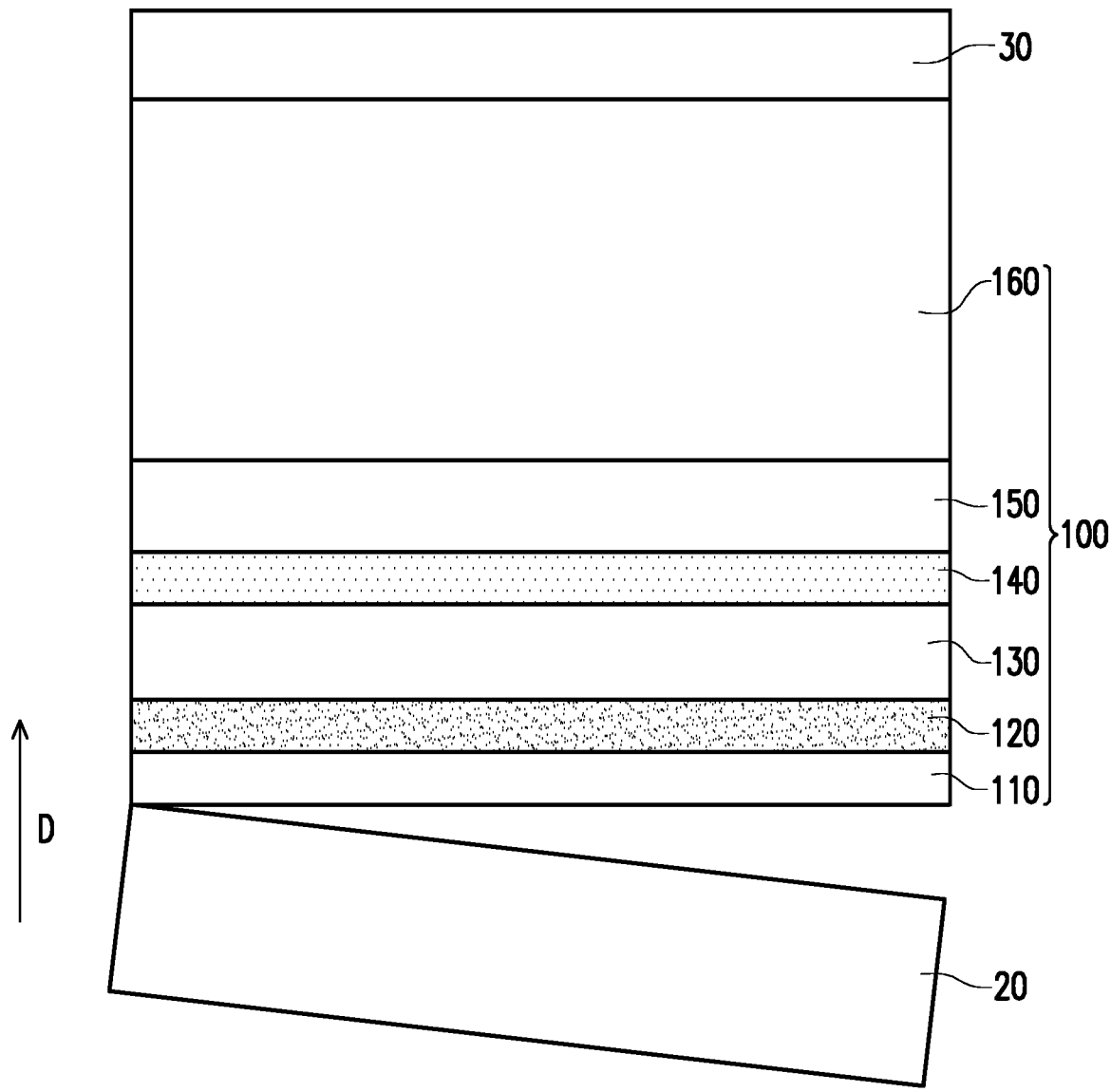

With reference to FIG. 1B, a second substrate 30 is disposed on the N-type window layer 160 of the GaAs epitaxial structure layer 100 through bonding, and the first substrate 20 is removed. In the embodiment, the second substrate 30 may be made of sapphire.

Figure 1C:
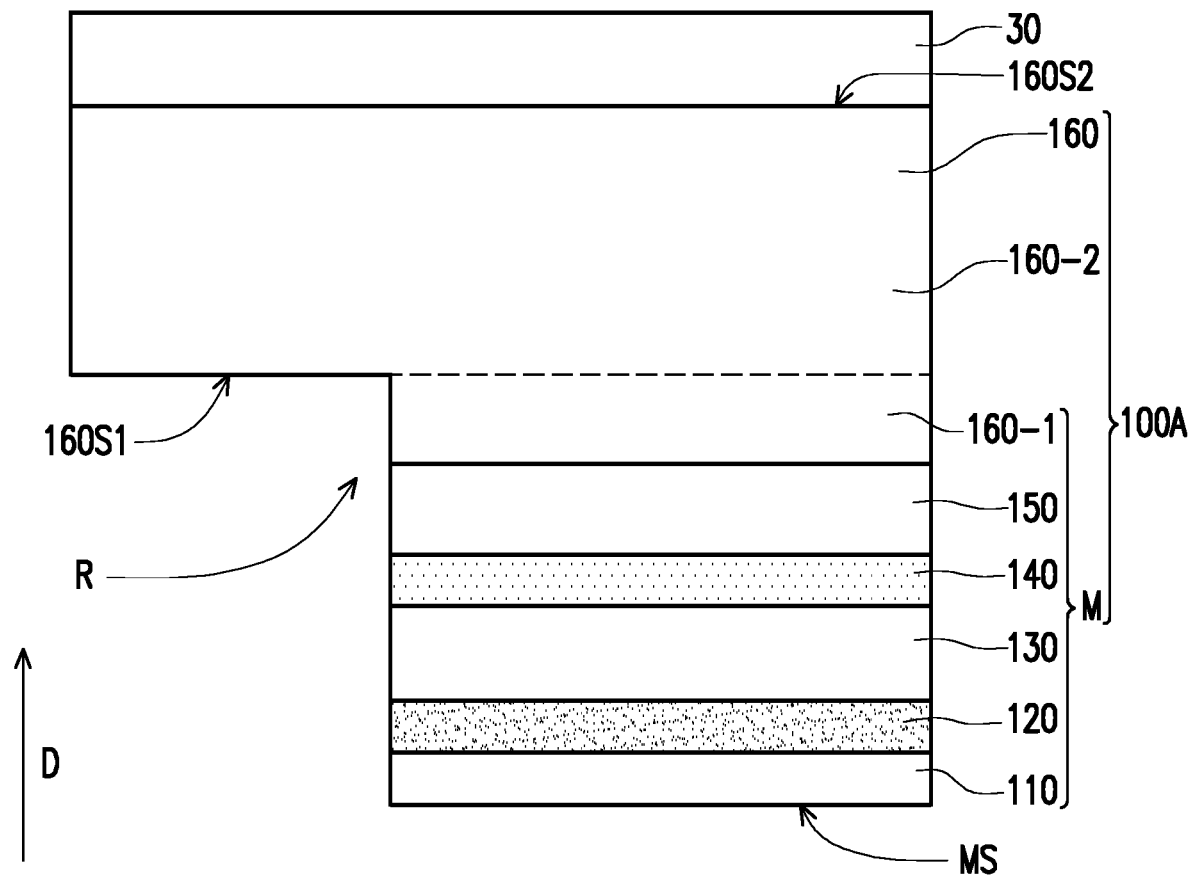

With reference to FIG. 1C, the GaAs epitaxial structure layer 100 is etched through inductively coupled plasma (ICP) etching or the like, so as to equip the GaAs epitaxial structure layer 100A with a concave portion R. In the embodiment, the concave portion R defines a platform structure M, and the concave portion R exposes a first surface 160S1 of the N-type window layer 160 on one side of the N-type window layer 160 opposite to the stacking direction D. In detail, the N-type contact layer 110, the tunneling junction layer 120, the P-type semiconductor layer 130, the light-emitting layer 140, the N-type semiconductor layer 150, and a portion 160-1 of the N-type window layer 160 of the GaAs epitaxial structure layer 100A form the platform structure M. An area of a platform surface MS of the platform structure M is smaller than an area of a second surface 160S2 of the N-type window layer 160 on the other side of the N-type window layer 160 facing the stacking direction D, and the platform surface MS is a surface of the N-type contact layer 110 on the side opposite to the stacking direction D.

Figure 1D:
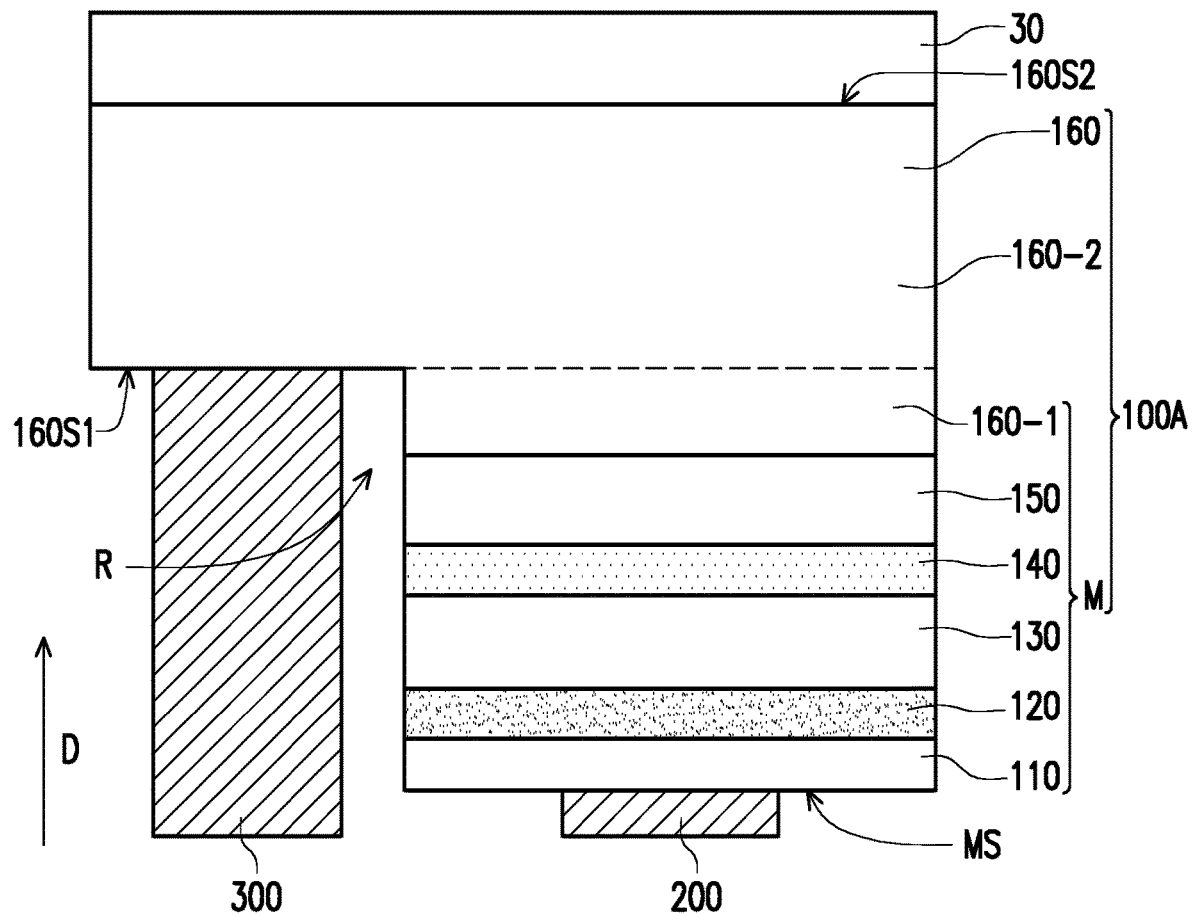

With reference to FIG. 1D, the first electrode 200 and the second electrode 300 may be bonded to the GaAs epitaxial structure layer 100A at the same time. In the embodiment, the first electrode 200 electrically contacts the N-type contact layer 110, and the second electrode 300 electrically contacts the N-type window layer 160. Furthermore, the second electrode 300 electrically contacts the first surface 160S1 exposed by the N-type window layer 160, and the first surface 160S1 is a surface of the N-type window layer 160 that does not belong to a portion 160-2 of the platform structure M. In the embodiment, a material of the first electrode 200 and the second electrode 300 may be a GeAu alloy or any other metal that may make ohmic contact with the N-type semiconductor.

Figure 1E:
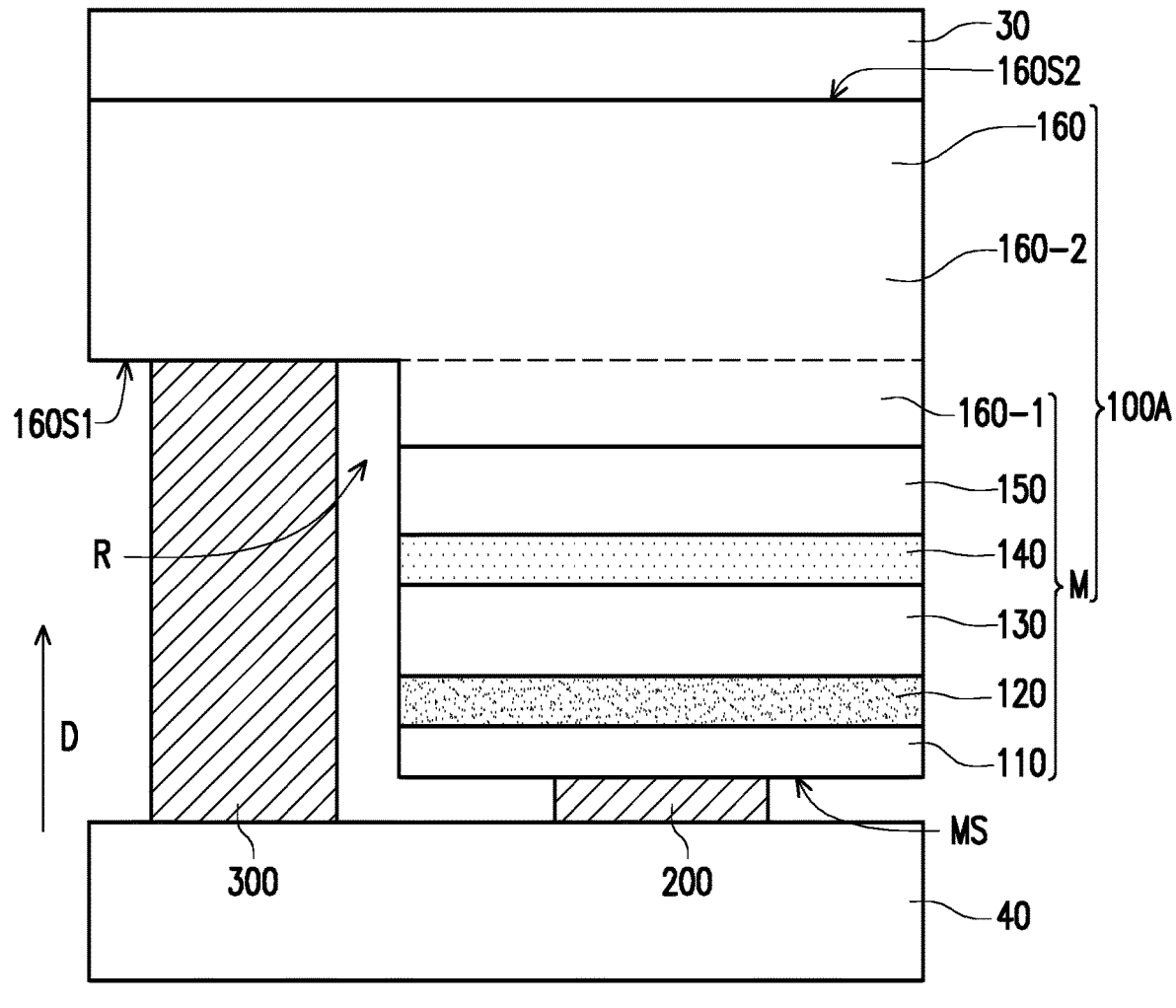

With reference to FIG. 1E, finally, the first electrode 200 and the second electrode 300 are adhered to a third substrate 40, so that the micro-LED chip 10A provided in the embodiment of the disclosure is formed. In the embodiment, a material of the third substrate 40 may be sapphire or glass. In addition, both the first electrode 200 and the second electrode 300 are located on one side of the micro-LED chip 10A opposite to the stacking direction D.

In another embodiment, the second substrate 30 of the micro-LED chip 10A in FIG. 1E may be further removed to facilitate subsequent transfer of the micro-LED chip 10A.

Based on the above, the micro-LED chip 10A provided in the embodiment of the disclosure has the tunneling junction layer 120, and the tunneling junction layer 120 is formed between the N-type contact layer 110 and the P-type semiconductor layer 130. Therefore, the P-type semiconductor layer 130 may be formed earlier than the N-type semiconductor layer 150 during the step of increasing the temperature in the semiconductor manufacturing process. As such, the P-type semiconductor layer 130 may be processed at a relatively low temperature. Furthermore, in the micro-LED chip 10A provided in the embodiment of the disclosure, it is only necessary to form a P-type semiconductor in the P-type semiconductor layer 130. Although the P-type semiconductor layer 130 adopts dopants that may be easily diffused, e.g., Mg, the structure of the P-type semiconductor layer 130 is already formed at a relatively low temperature, and thus the step of increasing the temperature in the subsequent manufacturing process does not pose any significant impact on the micro-LED chip 10A. Therefore, the yield of the micro-LED chip 10A is high. Moreover, when the P-type semiconductor layer 130 is the P-type semiconductor, which results in that the N-type semiconductor layer 150 may be an N-type semiconductor, it is not necessary to form the N-type window layer 160 as a P-type semiconductor, and the micro-LED chip 10A may reduce the use of Mg as a dopant, for instance. Therefore, the yield of the micro-LED chip 10A is high according to the embodiment of the disclosure.

Furthermore, an ohmic contact layer is often required to be additionally formed in the P-type semiconductor layer, so that a current coming from the P-type contact electrode may be effectively distributed to the light-emitting layer. The ohmic contact layer is, for instance, indium tin oxide (ITO). However, during the formation of the P-type contact electrode on the ohmic contact layer, the alloy temperature is about 500° C. to 550° C. Such a high temperature is prone to cause damages to semiconductor devices, which also affects the yield of the LED. In the micro-LED chip 10A provided in the embodiment of the disclosure, both the first electrode 200 and the second electrode 300 electrically contact the N-type semiconductor; therefore, it is not necessary to form an additional ohmic contact layer on the surface 160S1 and the platform surface MS in the GaAs epitaxial structure layer 100A which are in contact with the first electrode 200 and the second electrode 300, and the metal and the semiconductor may be bonded at a relatively low temperature, e.g., 300° C. to 350° C. As a result, the yield of the micro-LED chip 10A provided in the embodiment of the disclosure may be improved, and the cost may be reduced.

In addition, in an embodiment, each of a thickness of the N-type contact layer 110, a thickness of the tunneling junction layer 120, and a thickness of the light-emitting layer 140 of the GaAs epitaxial structure layer 100, 100A along the stacking direction D is preferably smaller than a thickness of each of the other layers of the GaAs epitaxial structure layer 100, 100A along the stacking direction D.

Figure 2:
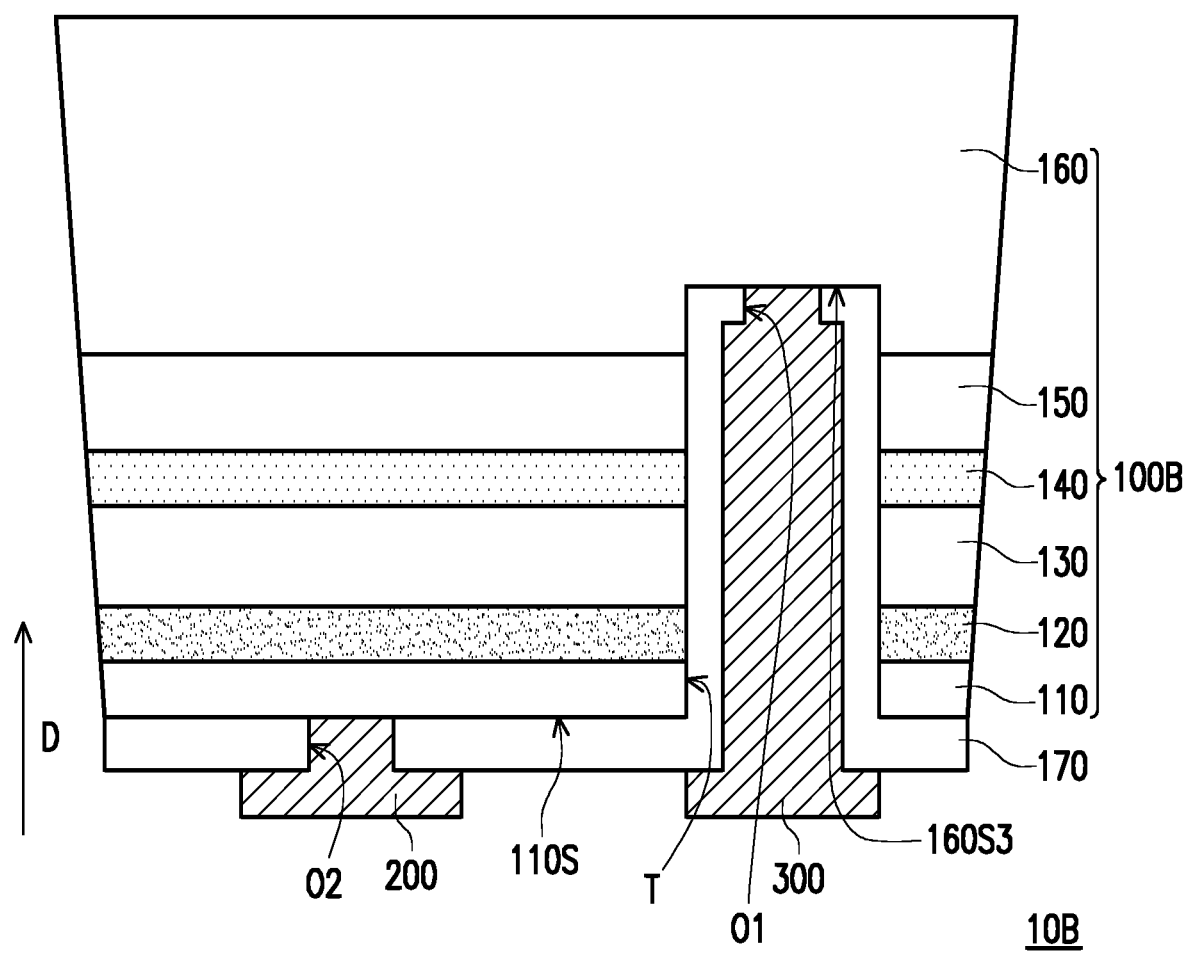
FIG. 2 is a schematic cross-sectional view of a micro-LED chip according to another embodiment of the disclosure.

FIG. 2 is a schematic cross-sectional view of a micro-LED chip according to another embodiment of the disclosure. With reference to FIG. 2, in the embodiment, a GaAs epitaxial structure layer 100B of a micro-LED chip 10B has a trench T that passes through the N-type contact layer 110, the tunneling junction layer 120, the P-type semiconductor layer 130, the light-emitting layer 140, the N-type semiconductor layer 150, and a portion of the N-type window layer 160, and the trench T exposes a third surface 160S3 of the N-type window layer 160 on the side of the N-type window layer 160 opposite to the stacking direction D.

In the embodiment, the second electrode 300 is disposed in the trench T and electrically contacts the third surface 160S3 of the N-type window layer 160.

In the embodiment, the micro-LED chip 10B further includes an insulation layer 170. The insulation layer 170 covers an inner wall of the trench T, so that the second electrode 300 is electrically insulated from the N-type contact layer 110, the tunneling junction layer 120, the P-type semiconductor layer 130, the light-emitting layer 140, and the N-type semiconductor layer 150. The insulation layer 170 is extended and disposed on the surface 110S of the N-type contact layer 110 on one side of the N-type contact layer 110 opposite to the stacking direction D. In addition, the insulation layer 170 has an opening O2 on the surface 110S disposed on the one side of the N-type contact layer 110 opposite to the stacking direction D. The first electrode 200 electrically contacts the N-type contact layer 110 through the opening O2. Furthermore, the insulation layer 170 has another opening O1 at the trench T, and the second electrode 300 electrically contacts the third surface 160S3 of the N-type window layer 160 through the opening O1.

Based on the above, in the micro-LED chip 10B provided in the embodiment of the disclosure, the GaAs epitaxial structure layer 100B of the micro-LED chip 10B has the trench T, and the micro-LED chip 10B further includes the insulation layer 170; therefore, the second electrode 300 may electrically contact the N-type window layer 160 through the trench T, given that the second electrode 300 is electrically insulated from the N-type contact layer 110, the tunneling junction layer 120, the P-type semiconductor layer 130, the light-emitting layer 140, and the N-type semiconductor layer 150. The micro-LED chip 10B provided in the embodiment of the disclosure may be adapted to a flip chip technology, which may facilitate a chip packaging process.

To sum up, the micro-LED chip provided in one or more embodiments of the disclosure has the tunneling junction layer formed between the N-type contact layer and the P-type semiconductor layer; therefore, the P-type semiconductor layer may be formed earlier than the N-type semiconductor layer during the step of increasing the temperature in the semiconductor manufacturing process. Thereby, the P-type semiconductor layer may be processed at the relatively low temperature, so that the step of increasing the temperature in the subsequent process does not pose any significant impact on the micro-LED chip. Accordingly, the micro-LED chip may have the high yield. Furthermore, in the micro-LED chip provided in one or more embodiments of the disclosure, no additional ohmic N-type contact layer is required to be formed on the surface of the GaAs epitaxial structure layer in contact with the first electrode and the second electrode, and the metal and the semiconductor may be bonded at a relatively low temperature. As such, the yield of the micro-LED chip provided in one or more embodiments of the disclosure may be improved, and the cost may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light-emitting diode chip adapted to emit a red light or an infrared light and comprising:
    a gallium arsenide (GaAs) epitaxial structure layer, comprising an N-type contact layer, a tunneling junction layer, a P-type semiconductor layer, a light-emitting layer, an N-type semiconductor layer, and an N-type window layer sequentially along a stacking direction;
    a first electrode, electrically contacting the N-type contact layer; and
    a second electrode, electrically contacting the N-type window layer,
    wherein the tunneling junction layer is doped with both N-type and P-type dopants, and a ratio of a molar concentration of the P-type dopant to a molar concentration of the N-type dopant falls within a range of 10 to 100,
    wherein each of a thickness of the N-type contact layer, a thickness of the tunneling junction layer, and a thickness of the light-emitting layer along the stacking direction is less than a thickness of each of the other layers of the GaAs epitaxial structure layer along the stacking direction.

2. The micro light-emitting diode chip according to claim 1, wherein the first electrode and the second electrode are located on one side of the micro light-emitting diode chip opposite to the stacking direction.

3. The micro light-emitting diode chip according to claim 1, wherein the GaAs epitaxial structure layer has a concave portion, the concave portion defines a platform structure, and the concave portion exposes a first surface of the N-type window layer on one side of the N-type window layer opposite to the stacking direction.

4. The micro light-emitting diode chip according to claim 3, wherein the N-type contact layer, the tunneling junction layer, the P-type semiconductor layer, the light-emitting layer, the N-type semiconductor layer, and a portion of the N-type window layer of the GaAs epitaxial structure layer form the platform structure, an area of a platform surface of the platform structure is smaller than an area of a second surface of the N-type window layer on the other side of the N-type window layer facing the stacking direction, and the platform surface is a surface of the N-type contact layer on one side of the N-type contact layer opposite to the stacking direction.

5. The micro light-emitting diode chip according to claim 1, wherein the GaAs epitaxial structure layer has a trench passing through the N-type contact layer, the tunneling junction layer, the P-type semiconductor layer, the light-emitting layer, the N-type semiconductor layer, and a portion of the N-type window layer, and the trench exposes a third surface of the N-type window layer on one side of the N-type contact layer opposite to the stacking direction.

6. The micro light-emitting diode chip according to claim 5, wherein the second electrode is disposed in the trench and electrically contacts the third surface of the N-type window layer.

7. The micro light-emitting diode chip according to claim 5, further comprising:
    an insulation layer, covering an inner wall of the trench so that the second electrode is electrically insulated from the N-type contact layer, the tunneling junction layer, the P-type semiconductor layer, the light-emitting layer, and the N-type semiconductor layer, the insulation layer being extended and disposed on a surface of the N-type contact layer on the one side of the N-type contact layer opposite to the stacking direction.

8. The micro light-emitting diode chip according to claim 1, wherein the thickness of the tunneling junction layer along the stacking direction falls within a range of 50 angstroms to 500 angstroms.

9. The micro light-emitting diode chip according to claim 1, wherein the molar concentration of the P-type dopant of the tunneling junction layer is greater than a molar concentration of a P-type dopant of the P-type semiconductor layer.

10. The micro light-emitting diode chip according to claim 1, wherein a base material of the tunneling junction layer is $(Al_xGa_{1-x})_yIn_{1-y}As_zP_{1-z}$, and $0 \leq x, y, z \leq 1$.

11. The micro light-emitting diode chip according to claim 1, wherein the P-type semiconductor layer has a magnesium dopant.

* * * * *